(12) United States Patent
Ochiai et al.

(10) Patent No.: US 10,488,685 B2
(45) Date of Patent: Nov. 26, 2019

(54) DISPLAY DEVICE (71) Applicant: Japan Display Inc., Tokyo (JP)

(72) Inventors: Takahiro Ochiai, Chiba (JP); Yuki Kuramoto, Mobara (JP); Masahiro Hoshiba, Mobara (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/152,506

(22) Filed: Oct. 5, 2018

(65) Prior Publication Data

US 2019/0041677 A1 Feb. 7, 2019

Related U.S. Application Data

(63) Continuation of application No. 15/145,028, filed on May 3, 2016, now Pat. No. 10,120,219, which is a (Continued)

(30) Foreign Application Priority Data

Nov. 21, 2011 (JP) .................................. 2011-254094

(51) Int. Cl.
 G02F 1/1345 (2006.01)
 G02F 1/133 (2006.01)
 (Continued)

(52) U.S. Cl.
 CPC ........ G02F 1/13306 (2013.01); G02F 1/1339 (2013.01); G02F 1/1341 (2013.01);
 (Continued)

(58) Field of Classification Search
 None
 See application file for complete search history.

(56) References Cited

U.S. PATENT DOCUMENTS 8,363,199 B2 1/2013 Sekiya et al.
9,360,716 B2 6/2016 Ochiai et al.
(Continued)

FOREIGN PATENT DOCUMENTS

JP 2003-149673 A 5/2003
JP 2006-039524 A 2/2006
(Continued)

OTHER PUBLICATIONS

Chinese Office Action dated Dec. 1, 2014 regarding the corresponding Chinese Patent Application No. 20120482632.7.
(Continued)

*Primary Examiner* — Richard H Kim
(74) *Attorney, Agent, or Firm* — Michael Best & Friedrich LLP (57) ABSTRACT

A liquid crystal display device includes a thin film transistor substrate, a counter substrate that faces the thin film transistor substrate, a liquid crystal composition that is arranged between the thin film transistor substrate and the counter substrate, an oriented film that arranges orientation of the liquid crystal composition contacting with the thin film transistor substrate, a seal material that seals the liquid crystal composition between the two substrates, and a driver circuit. The driver circuit has a light transmission area that is formed inside of the driver circuit, and is higher in light transmittance than an area in which a non-transparent conductive film forming the driver circuit is formed, and a high sealing property area in which the seal material and an insulating film come into direct contact with each other between the light transmission area and an outer edge of the thin film transistor substrate.

9 Claims, 9 Drawing Sheets

Related U.S. Application Data continuation of application No. 14/729,889, filed on Jun. 3, 2015, now Pat. No. 9,360,716, which is a continuation of application No. 13/677,349, filed on Nov. 15, 2012, now Pat. No. 9,122,113.

(51) Int. Cl.
| | |
|---|---|
| *G02F 1/1368* | (2006.01) |
| *G02F 1/1339* | (2006.01) |
| *G02F 1/1341* | (2006.01) |
| *H01L 29/417* | (2006.01) |
| *G09G 3/36* | (2006.01) |
| *G11C 19/28* | (2006.01) |

(52) U.S. Cl.
CPC ........ *G02F 1/1368* (2013.01); *G02F 1/13454* (2013.01); *G09G 3/3648* (2013.01); *G11C 19/28* (2013.01); *H01L 29/41733* (2013.01); *H01L 29/41758* (2013.01); *G09G 2310/0286* (2013.01)

(56) References Cited

U.S. PATENT DOCUMENTS

| | | |
|---|---|---|
| 2002/0030784 A1 | 3/2002 | Onaka et al. |
| 2006/0022201 A1 | 2/2006 | Kim et al. |
| 2006/0049404 A1 | 3/2006 | Park et al. |
| 2010/0079718 A1 | 4/2010 | Sekiya et al. |
| 2010/0163879 A1 | 7/2010 | Jung et al. |

FOREIGN PATENT DOCUMENTS

| | | |
|---|---|---|
| JP | 2006-080472 A | 3/2006 |
| JP | 2007-322927 A | 12/2007 |
| JP | 2011-232385 A | 11/2011 |

OTHER PUBLICATIONS

Office Action issued by Japanese Patent Office dated Jun. 23, 2015 for corresponding Japanese Application No. 2011-254094.

DISPLAY DEVICE

CROSS-REFERENCE TO RELATED APPLICATIONS

This application is a continuation of U.S. patent application Ser. No. 15/145,028 filed on May 3, 2016, which, in turn, is a continuation of U.S. patent application Ser. No. 14/729,889 (now U.S. Pat. No. 9,360,716) filed on Jun. 3, 2015, which, in turn, is a continuation of U.S. patent application Ser. No. 13/677,349 (now U.S. Pat. No. 9,122,113) filed on Nov. 15, 2012. Further, this application claims priority from Japanese application JP2011-254094 filed on Nov. 21, 2011, the entire contents of which are hereby incorporated by reference into this application.

BACKGROUND OF THE INVENTION

1. Field of the Invention

The present invention relates to a liquid crystal display device.

2. Description of the Related Art

As an information communication terminal such as a computer and a display device such as a television, liquid crystal display devices have been widely used. The liquid crystal display device changes an orientation of a liquid crystal composition confined between two glass substrates according to a change in electric field, and controls the degree of transmission of light that passes through the two glass substrates and the liquid crystal composition to display an image.

In the liquid crystal display device, there is a need to arrange a driver circuit for applying a voltage corresponding to a given tone value to respective pixels on a screen on the glass substrate or a circuit board connected to the glass substrate. There has been known the driver circuit that is incorporated into an IC (integrated circuit) chip, and placed on the glass substrate. In recent years, it is desirable to narrow an area outside a display area on the glass substrate (hereinafter referred to as "frame area"). Therefore, there is a case in which a thin film transistor is formed on the frame area without mounting the IC chip thereon, and the driver circuit is arranged directly on the glass substrate without using the IC chip.

JP 2006-080472 A discloses a structure in which a parasitic capacity is reduced in an amorphous silicon thin film transistor arranged in the frame area.

In the liquid crystal display device having the frame area thus narrowed, an oriented film that defines the orientation of the liquid crystal composition may be formed on the driver circuit, and a seal with which a portion between the glass substrates is sealed may be formed on the oriented film. In this case, when the adhesiveness of the seal formed on the oriented film is not sufficient, or the seal is not sufficiently cured, there is a risk that moisture penetrates inside of a panel to adversely affect the characteristic of the liquid crystal composition.

SUMMARY OF THE INVENTION

The present invention has been made in view of the above-mentioned circumstances, and therefore an object of the present invention is to provide a display device that can seal the liquid crystal composition with high sealing property while realizing the narrowed frame area.

According to the present invention, there is provided a liquid crystal display device, including a thin film transistor substrate on which a thin film transistor is formed; a counter substrate that faces a surface of the thin film transistor substrate on which the thin film transistor is formed; a liquid crystal composition that is arranged between the thin film transistor substrate and the counter substrate; an oriented film that arranges orientation of the liquid crystal composition contacting with the thin film transistor substrate; a seal material that sticks the thin film transistor substrate and the counter substrate together, and seals the liquid crystal composition; and a driver circuit that is formed outside of a display area of the thin film transistor substrate with the user of the thin film transistor, and outputs a scanning signal to scanning signal lines in the display area, in which the driver circuit has a light transmission area that is formed inside of the driver circuit, and is higher in light transmittance than an area in which a non-transparent conductive film forming the driver circuit is formed, and a high sealing property area in which the seal material and an insulating film come into direct contact with each other between the light transmission area and an outer edge of the thin film transistor substrate, when viewed from a display direction.

Also, in the liquid crystal display device according to the present invention, in the driver circuit, a main transistor having a source or a drain connected directly or indirectly to the scanning signal line may have a plurality of pectinate channel areas in which a pectinate drain signal line and a pectinate source signal line are alternating with each other, the transistors formed by the plurality of pectinate channel areas may form circuits connected in parallel to each other, and the light transmission area may be arranged between the plurality of pectinate channel areas when viewed from the display direction.

Also, in the liquid crystal display device according to the present invention, the light transmission area may be surrounded by a gate signal line of the main transistor in at least three ways, when viewed from the display direction.

Also, in the liquid crystal display device according to the present invention, the light transmission area may be surrounded by at least one of a source signal line and a drain signal line of the main transistor in at least three ways, when viewed from the display direction.

Also, in the liquid crystal display device according to the present invention, the plurality of pectinate channel areas may be formed by forming the main transistor into a crank shape as a whole.

Also, in the liquid crystal display device according to the present invention, the light transmission area may be surrounded by an electrode forming a capacitor in the driver circuit in at least three ways, when viewed from the display direction.

Also, in the liquid crystal display device according to the present invention, the oriented film may be stacked on the light transmission area.

DETAILED DESCRIPTION OF THE INVENTION

Hereinafter, a description will be given of a first embodiment and a second embodiment of the present invention with reference to the accompanying drawings. In the drawings, the same or equivalent elements are denoted by identical reference numerals or symbols, and repetitive description will be omitted.

First Embodiment

Figure 1:
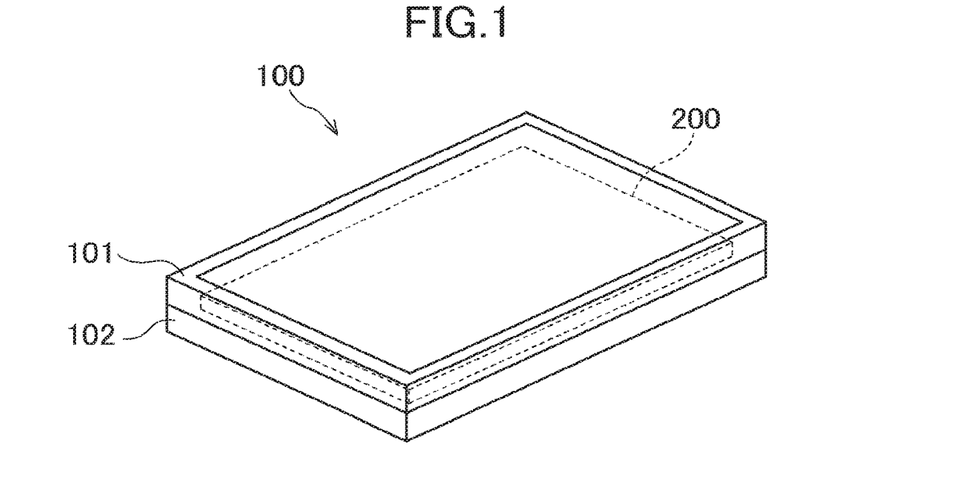
FIG. 1 is a schematic diagram illustrating a liquid crystal display device according to a first embodiment of the present invention.

FIG. 1 schematically illustrates a liquid crystal display device 100 according to a first embodiment of the present invention. As illustrated in the figure, the liquid crystal display device 100 includes a liquid crystal panel 200 fixed to be sandwiched between an upper frame 101 and a lower frame 102.

Figure 2:
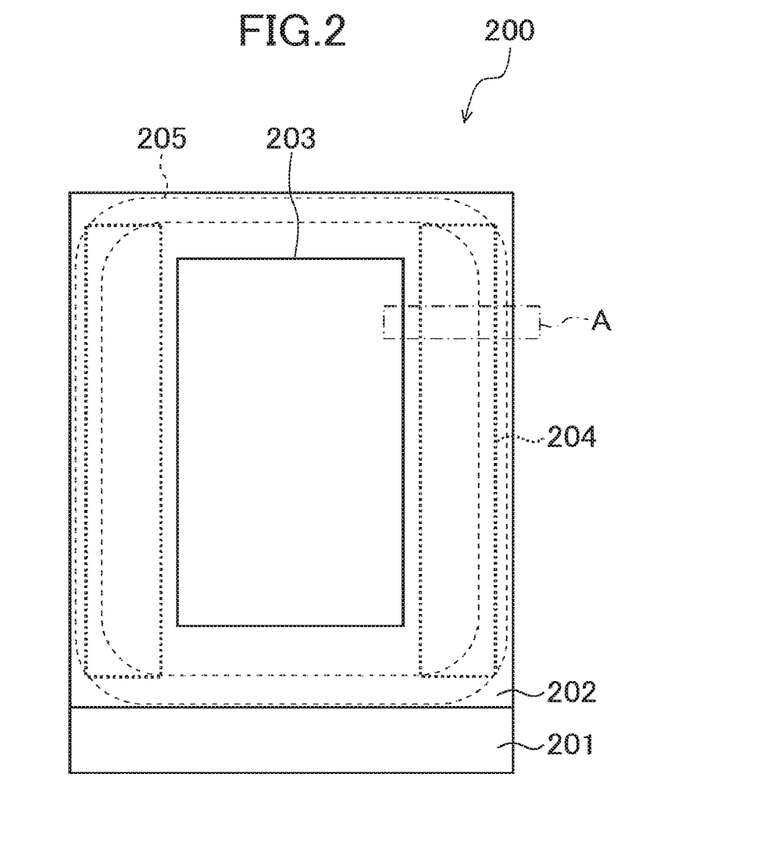
FIG. 2 is a front view illustrating a liquid crystal panel in FIG. 1.

FIG. 2 illustrates a front view of the liquid crystal panel 200. As illustrated in the figure, the liquid crystal panel 200 includes a thin film transistor substrate 201 having pixel circuits each using a thin film transistor formed in a display area 203, and a driver circuit 204 using thin film transistors formed around the display area 203, a color filter substrate 202 having color filters of respective colors of R (red), G (green), and B (blue) formed for each of pixels, which is a counter substrate facing the thin film transistor substrate 201, a liquid crystal composition sealed between the thin film transistor substrate 201 and the color filter substrate 202, and a seal material 205 for sealing the liquid crystal composition between the thin film transistor substrate 201 and the color filter substrate 202.

Figure 3:
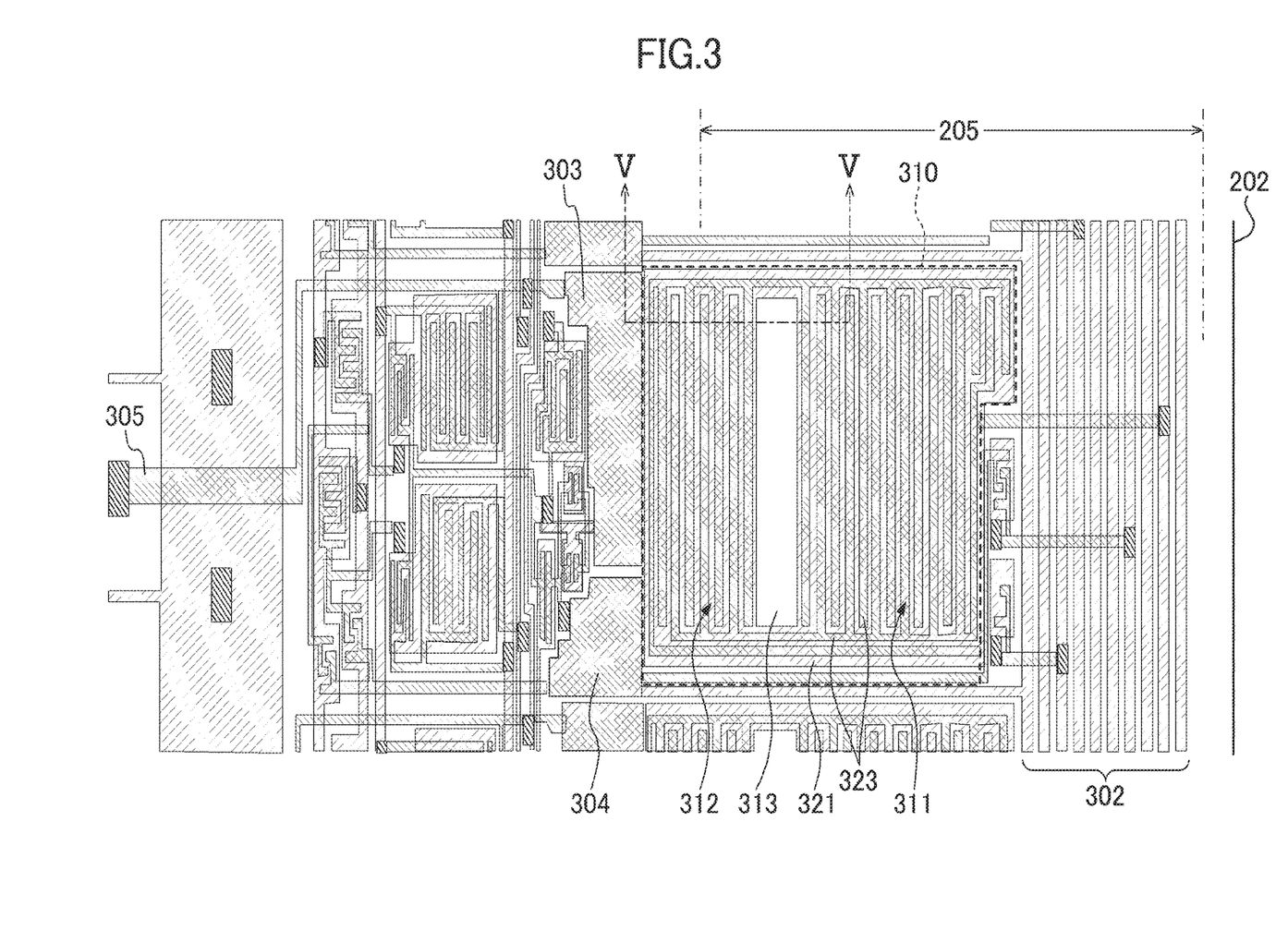
FIG. 3 is an enlarged diagram illustrating an appearance of wiring in an area A of a driver circuit in FIG. 2.

FIG. 3 is an enlarged diagram illustrating an appearance of wiring in an area A of the driver circuit 204 in FIG. 2. In FIG. 3, there are shown a scanning signal line 305 that is connected to gates of pixel transistors in the display area, a plurality of circuit drive signal lines 302 to which a plurality of different clock signals are each supplied, a main transistor 310 for supplying a clock signal of one circuit drive signal line 302 to the scanning signal line 305 at a given timing, a capacitor 303, and a capacitor 304. As illustrated in the figure, the main transistor 310 includes pectinate channel areas 311 and 312 having pectinate source and drain electrodes engaged with each other. Between the pectinate channel areas 311 and 312 are formed a light transmission area 313 in which a non-transparent conductive film is not formed, but a light transmittance is higher than that in an area where the non-transparent conductive film is formed.

The circuit and wirings illustrated in FIG. 3 are exemplary, and a circuit used for the driver circuit 204 may be another circuit that supplies a pulse signal to the scanning signal line at a given timing. In this example, the light transmission area 313 is surrounded by a gate signal line formed of a first conductive film 321 in four ways, and also surrounded by a source signal line and a drain signal line formed of a second conductive film 323 in three ways.

Figure 4:
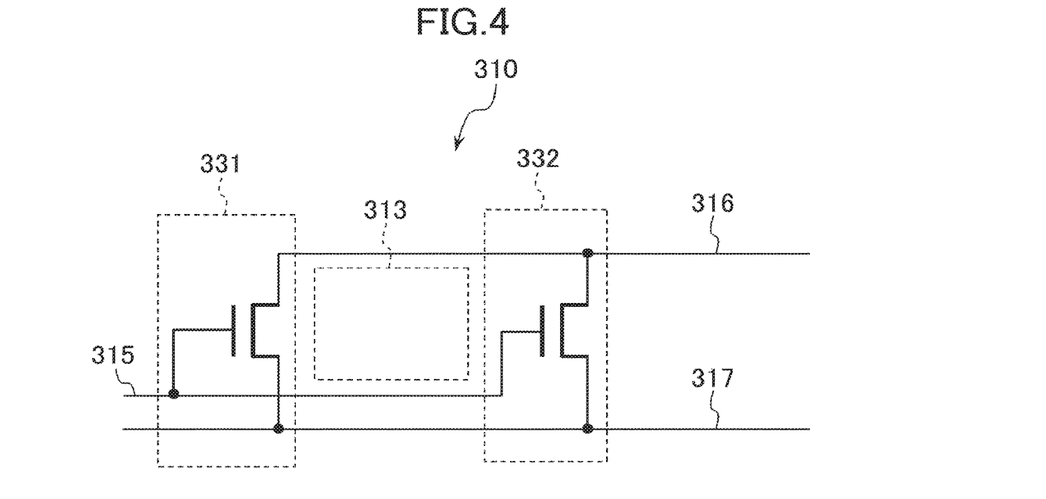
FIG. 4 is a circuit diagram illustrating a main transistor in FIG. 3.

FIG. 4 illustrates a circuit diagram of the main transistor 310. As illustrated in the circuit diagram, the main transistor 310 is configured so that a first sub-transistor 331 formed by the pectinate channel area 311 and a second sub-transistor 332 formed by the pectinate channel area 312 are connected in parallel to each other. A gate, a drain, and a source of the first sub-transistor 331, and a gate, a drain, and a source of the second sub-transistor 332 are connected to one node 315, one pulse signal line 316, and one fixed signal line 317, respectively.

Figure 5:
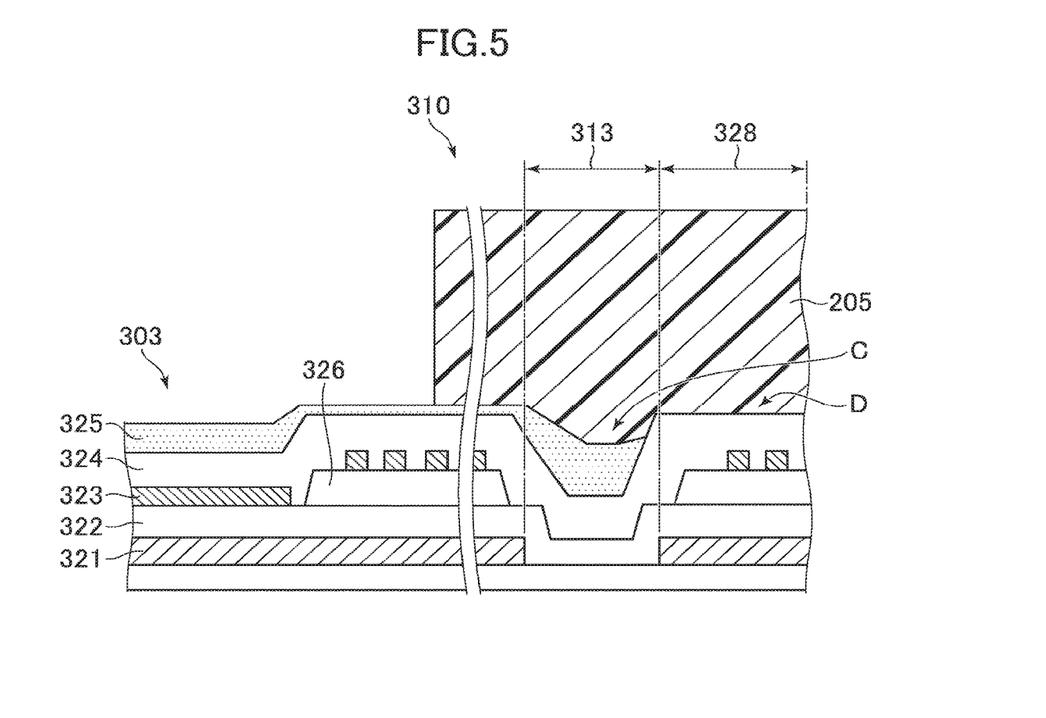
FIG. 5 is a schematically cross-sectional view taken along a line V-V in FIG. 3.

FIG. 5 is a schematically cross-sectional view taken along a line V-V in FIG. 3. FIG. 5 illustrates a cross-section of the main transistor 310 and the capacitor 303 with the inclusion of the first conductive film 321 which is an opaque metal film formed as a part of the thin film transistor substrate 201, a first insulating film 322, a semiconductor film 326, the second conductive film 323 which is an opaque metal film, a second insulating film 324, an oriented film 325 formed so as to be poured from the display area 203 side, and the seal material 205 formed for sealing the liquid crystal composition between the seal material 205 and the color filter substrate 202. The liquid crystal composition and the film on the color filter substrate 202 are omitted from the drawing.

As schematically illustrated in the figure, the first conductive film 321, the first insulating film 322, the semiconductor film 326, the second conductive film 323, and the second insulating film 324 are formed in the stated order. Thereafter, the oriented film 325 formed so as to be poured from the display area 203 side is so stemmed as to be impounded in a recess C of the light transmission area 313, and the oriented film 325 is not arranged in an area D. With this configuration, a high sealing property area 328 is formed in which the second insulating film 324 and the seal material 205 come into direct contact with each other through no oriented film 325. As a result, the adhesiveness and the tightness of the seal material 205 can be improved, moisture can be prevented from penetrating inside of a liquid crystal panel, and the characteristics of the liquid crystal composition can be enhanced.

Also, in an ultraviolet irradiation process for curing the seal material 205, because ultraviolet rays transmit from the light transmission area 313, the seal material 205 can be sufficiently cured, and moisture can be prevented from penetrating inside of the liquid crystal panel caused by uncuring.

Figure 6:
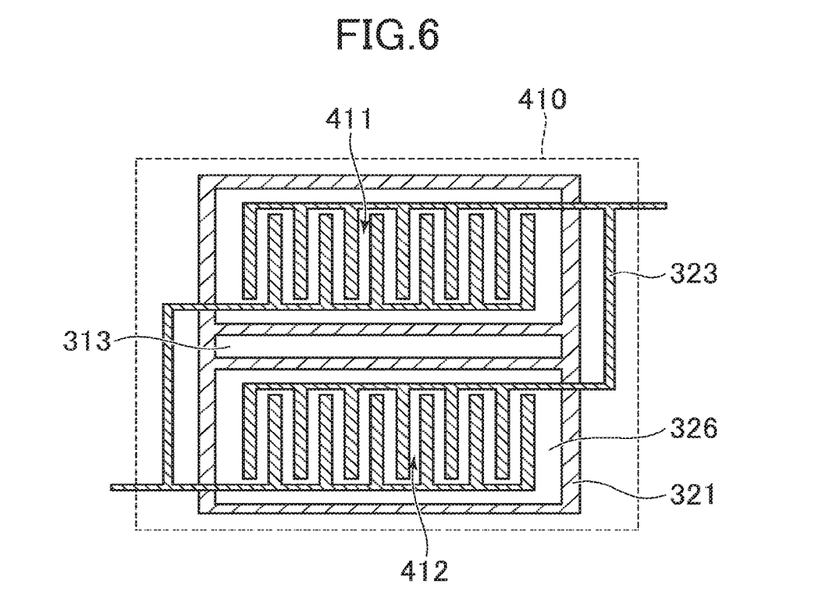
FIG. 6 is a diagram illustrating a main transistor according to a first modified example of the first embodiment.

FIG. 6 schematically illustrates a main transistor 410 which is a first modified example of the main transistor 310 of the first embodiment. As illustrated in the figure, in the main transistor 410, the light transmission area 313 is formed between pectinate channel areas 411 and 412 as in the main transistor 310. However, the main transistor 410 is different from the main transistor 310 in that a direction of extending the light transmission area 313 is perpendicular to a direction of extending the pectinate source and drain. Even in this configuration, the main transistor 410 is configured so that a first sub-transistor formed by the pectinate channel area 411 and a second sub-transistor formed by the pectinate channel area 412 are connected in parallel to each other. Also, the light transmission area 313 is surrounded by a gate signal line formed of the first conductive film 321 in four ways, and surrounded by a source signal line and a drain signal line formed of the second conductive film 323 in three ways.

Figure 7:
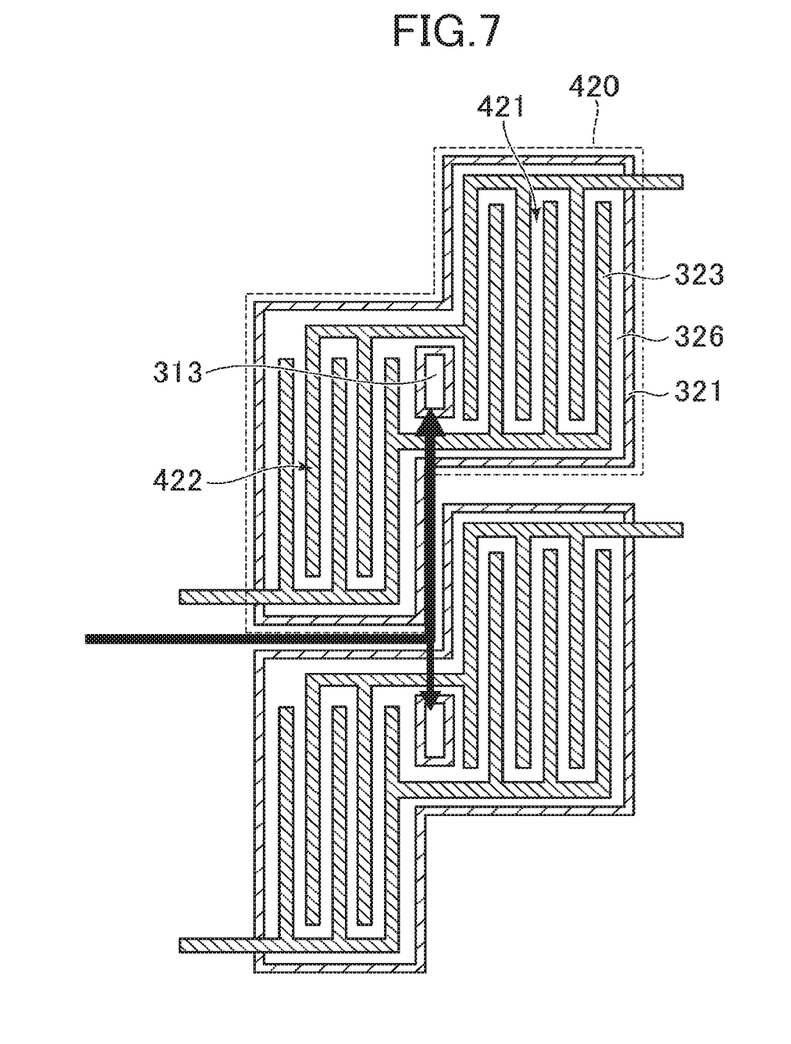
FIG. 7 is a diagram illustrating a main transistor according to a second modified example of the first embodiment.

FIG. 7 schematically illustrates a main transistor 420 which is a second modified example of the main transistor 310 of the first embodiment. As illustrated in the figure, the main transistor 420 is formed into a crank shape as a whole to form pectinate channel areas 421 and 422, and the light transmission area 313 is formed between the pectinate channel areas 421 and 422. Thus, the main transistor 920 is formed into the crank shape as a whole, as a result of which a boundary between the main transistor and the adjacent main transistor is also formed into the crank shape, and a progress of the oriented film poured into the configuration as illustrated in FIG. 7 is slowed, thereby making it difficult to put the oriented film on an entire surface of the second insulating film. As a result, the second insulating film and the seal material are liable to come into direct contact with each other. Even in this configuration, the main transistor 420 is configured so that the first sub-transistor formed by the pectinate channel area 421 and the second sub-transistor formed by the pectinate channel area 422 are connected in parallel to each other. Also, the light transmission area 313 is surrounded by the gate signal line formed of the first conductive film 321 in four ways, and also surrounded by the source signal line and the drain signal line formed of the second conductive film 323 in the three directions.

Figure 8:
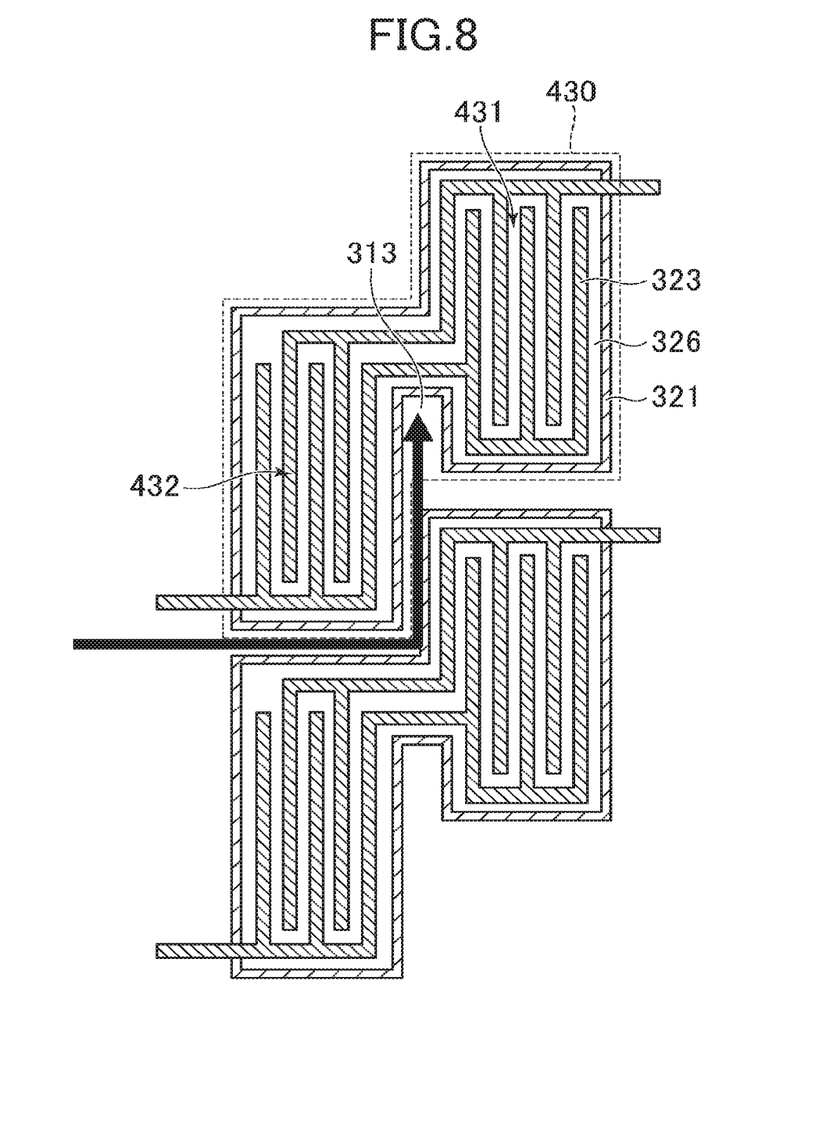
FIG. 8 is a diagram illustrating a main transistor according to a third modified example of the first embodiment.

FIG. 8 schematically illustrates a main transistor 430 which is a third modified example of the main transistor 310 of the first embodiment. As illustrated in the figure, as in the second modified example, the main transistor 430 is formed into a crank shape as a whole to form pectinate channel areas 431 and 432, and the light transmission area 313 is formed between the pectinate channel areas 431 and 432. In this example, the light transmission area 313 is not arranged between the source line and the drain linen as in the second modified example, but the source line and the drain line approach one side, and the other side at which the source line and the drain line are not present is set as the light transmission area 313 coupled to a boundary between the main transistor and the adjacent main transistor. With the above configuration, the oriented film 325 (refer to FIG. 5) poured into the boundary between the respective main transistors as indicated by an arrow in FIG. 8 can arrive at the light transmission area 313 without a need to exceed a barrier of height, and the oriented film 325 is liable to be accumulated in the light transmission area 313. Even in this configuration, the main transistor 430 is configured so that the first sub-transistor formed by the pectinate channel area 431 and the second sub-transistor formed by the pectinate channel area 432 are connected in parallel to each other. Also, the light transmission area 313 is surrounded by the gate signal line formed of the first conductive film 321 in the three ways, and also surrounded by the source signal line and the drain signal line formed of the second conductive film 323 in the three ways.

Figure 9:
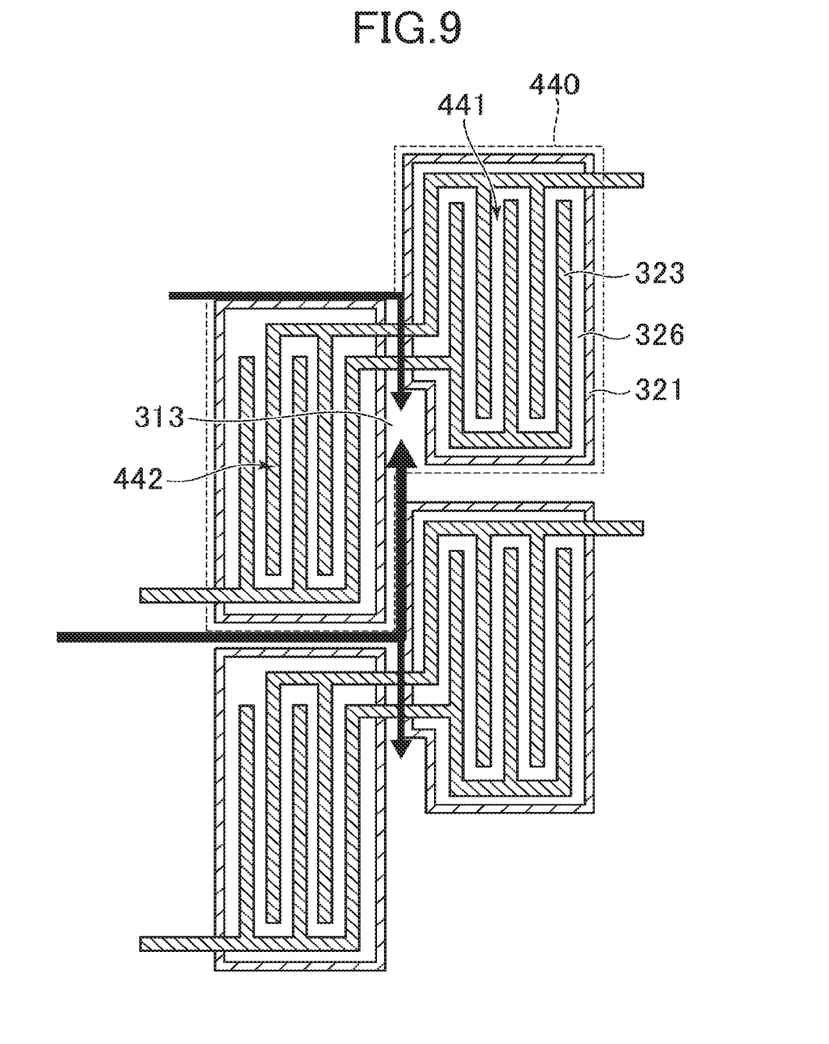
FIG. 9 is a diagram illustrating a main transistor according to a fourth modified example of the first embodiment.

FIG. 9 schematically illustrates a main transistor 440 which is a fourth modified example of the main transistor 310 of the first embodiment. As illustrated in the figure, as in the third modified example, the main transistor 440 is formed into a crank shape as a whole to form pectinate channel areas 441 and 442, and the light transmission area 313 coupled to the boundary between the main transistor and the adjacent main transistor is formed. Further, the main transistor 440 is different from the main transistor 310 in that the first conductive film 321 and the semiconductor film 326 are separated by the pectinate channel areas 441 and 442. With this configuration, the oriented film 325 (refer to FIG. 5) is poured into the light transmission area 313 from two ways as indicated by an arrow in FIG. 9 so that the oriented film 325 is more liable to be accumulated in the light transmission area 313. Even in this configuration, the main transistor 440 is configured so that the first sub-transistor formed by the pectinate channel area 441 and the second sub-transistor formed by the pectinate channel area 442 are connected in parallel to each other. Also, the light transmission area 313 is surrounded by the source signal line and the drain signal line formed of the second conductive film 323 in the three ways.

Even in the configurations illustrated in the above-mentioned first to fourth modified examples, as with the main transistor 310 in the first embodiment, the oriented film is so stemmed as to be impounded in the light transmission area 313, and a high sealing property area 328 in which the second insulating film and the seal material come into direct contact with each other through no oriented film is formed. As a result, the adhesiveness and the tightness of the seal material can be improved, moisture can be prevented from penetrating inside of the liquid crystal panel, and the characteristics of the liquid crystal composition can be enhanced.

Also, in the ultraviolet irradiation process for curing the seal material, because ultraviolet rays transmit from the light transmission area 313, the seal material can be sufficiently cured, and moisture can be prevented from penetrating inside of the liquid crystal panel caused by uncuring.

Second Embodiment

A second embodiment of the present invention will be described. A configuration of a display device according to the second embodiment is identical with the configuration of the first embodiment illustrated in FIGS. 1 and 2, and therefore a repetitive description will be omitted.

Figure 10:
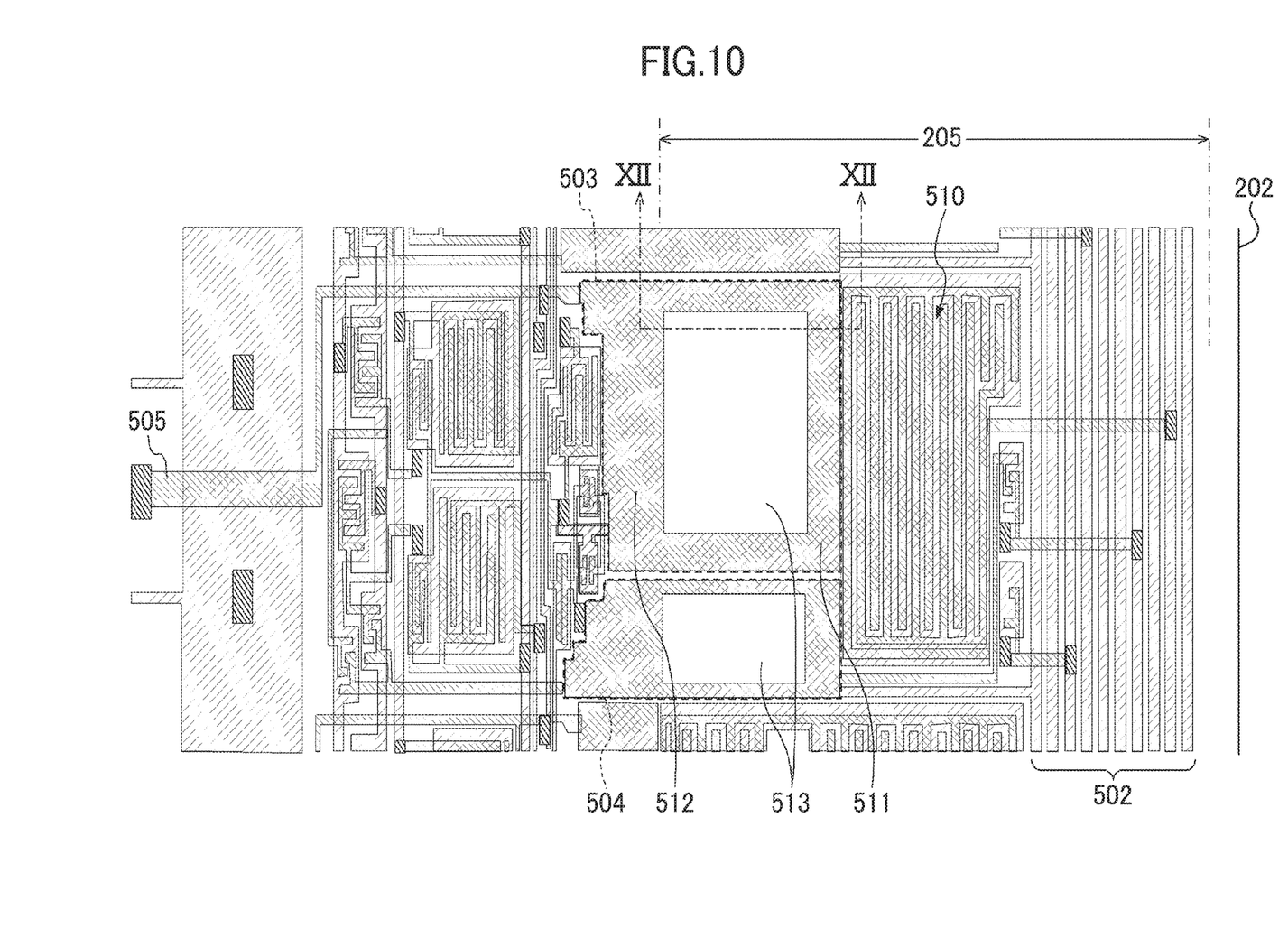
FIG. 10 is an enlarged diagram illustrating an appearance of wiring in an area A of a driver circuit in FIG. 2 in the second embodiment.

FIG. 10 is an enlarged diagram illustrating an appearance of wiring in an area A of the driver circuit 204 in FIG. 2. In FIG. 10, as in FIG. 3 of the first embodiment, there are shown a scanning signal line 505 that is connected to gates of pixel transistors in the display area, a plurality of circuit drive signal lines 502 to which a plurality of different clock signals are each supplied, a main transistor 510 for supplying a clock signal of one circuit drive signal line 502 to the scanning signal line 505 at a given timing, a capacitor 503, and a capacitor 504. As illustrated in the figure, inside of each of the capacitor 503 and the capacitor 504 a non-transparent conductive film is not formed, but a light transmission area 513 which is higher in the light transmittance than that an area where the non-transparent conductive film is formed is formed. In this example, the light transmission area 513 is surrounded by electrodes of the capacitor 503 or 504 in the four ways, but may be surrounded in the three ways, and opened in one way.

Figure 11:
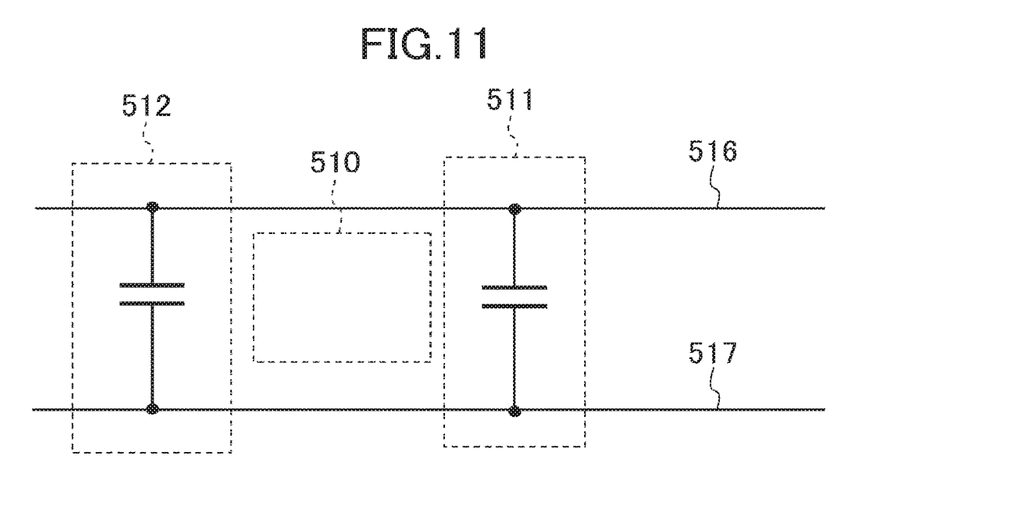
FIG. 11 is a circuit diagram of a capacitor in FIG. 10.

FIG. 11 is a circuit diagram of the capacitor 503 divided by the light transmission area 513. As illustrated in the circuit diagram, the capacitor 503 is structured by a first sub-capacitor 511 and a second sub-capacitor 512 which are divided by the light transmission area 513 and connected in parallel to each other. Both ends of the first sub-capacitor 511 and the second sub-capacitor 512 are connected to one scanning signal line 516 and one fixed signal line 517, respectively.

Figure 12:
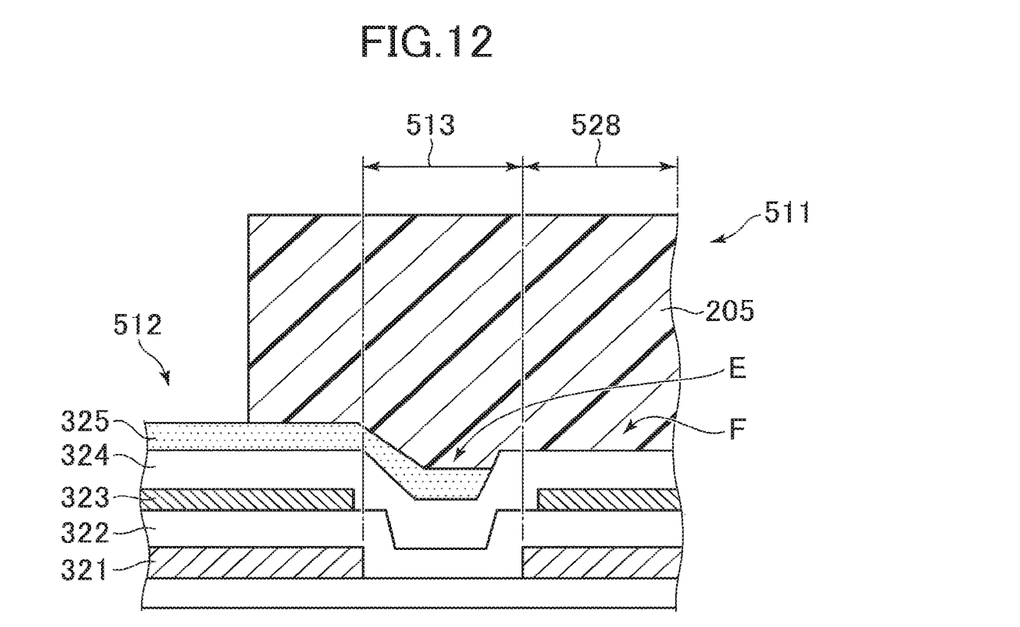
FIG. 12 is a schematically cross-sectional view taken along a line XII-XII in FIG. 10.

FIG. 12 is a schematically cross-sectional view taken along a line XII-XII in FIG. 10. FIG. 12 illustrates a cross-section of the sub-capacitor 512, with the inclusion of the first conductive film 321 which is an opaque metal film formed as a part of the thin film transistor substrate 201, the first insulating film 322, the second conductive film 323 that is an opaque metal film, the second insulating film 324, the oriented film 325 formed so as to be poured from the display area 203 side, and the seal material 205 formed for sealing the liquid crystal composition between the thin film transistor substrate 201 and the color filter substrate 202. The liquid crystal composition and the film on the color filter substrate 202 are omitted from the drawing.

As illustrated in the figure, the first conductive film 321, the first insulating film 322, the second conductive film 323, and the second insulating film 324 are formed in the stated order. Thereafter, the oriented film 325 formed so as to be poured from the display area 203 side is so stemmed as to be impounded in a recess E of the light transmission area 513, and the oriented film 325 is not arranged in an area F. With this configuration, a high sealing property area 528 is formed in which the second insulating film 324 and the seal material 205 come into direct contact with each other through no oriented film 325. As a result, the adhesiveness and the tightness of the seal material 205 can be improved, moisture can be prevented from penetrating inside of a liquid crystal panel, and the characteristics of the liquid crystal composition can be enhanced.

Also, in an ultraviolet irradiation process for curing the seal material 205, because ultraviolet rays transmit from the light transmission area 313, the seal material 205 can be sufficiently cured, and moisture can be prevented from penetrating inside of the liquid crystal panel caused by uncuring.

The liquid crystal display device according to the abovementioned embodiments can be applied to any one of an IPS (in-plane switching) system, a VA (vertically aligned) system, and a TN (twisted nematic) system although the system is not particularly designated.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A display device, comprising:
a display area in which a plurality of pixels are formed; and
a driver circuit that is formed outside of the display area and includes a main thin film transistor and a capacitor,
wherein the main thin film transistor has a first channel area, a second channel area, and a light transmittance portion between the first and second channel areas,
the first and second channel areas include a semiconductor film, a comb-like source electrode and a comb-like drain electrode engaged with each other on the semiconductor film, and a gate electrode being a part of a first conductive film,
the comb-like source electrode includes more source electrodes in the first channel area than in the second channel area,
the comb-like drain electrode includes more drain electrodes in the first channel area than in the second channel area,
the capacitor has portions of the first conductive film and a second conductive film opposite to the first conductive film,
the light transmittance portion is higher in light transmittance than the first conductive film or the second conductive film,
the light transmittance portion includes an opening surrounded on every side by the first conductive film, and
the comb-like source electrode and the comb-like drain electrode are spaced at a distance smaller than a width of the opening, in the first channel area.

2. The display device according to claim 1,
wherein the light transmittance portion is surrounded by at least one of a source signal line and a drain signal line of the main thin film transistor in at least three ways, when viewed from a display direction.

3. The display device according to claim 1,
wherein the first and second channel areas are formed into a crank shape as a whole.

4. The display device according to claim 1,
wherein the light transmittance portion is surrounded by the first and second conductive film in at least three ways, when viewed from a display direction.

5. A display device, comprising:
a display area in which a plurality of pixels are formed; and
a driver circuit that is formed outside of the display area and includes a main thin film transistor and a capacitor,
wherein the main thin film transistor has a first channel area, a second channel area, and a light transmittance portion between the first and second channel areas,
the first and second channel areas include a semiconductor film, a comb-like source electrode and a comb-like drain electrode engaged with each other on the semiconductor film, and a gate electrode,
the comb-like source electrode includes more source electrodes in the first channel area than in the second channel area,
the comb-like drain electrode includes more drain electrodes in the first channel area than in the second channel area,
the capacitor has portions of a first conductive film and a second conductive film opposite to the first conductive film,
the light transmittance portion is higher in light transmittance than the first conductive film or the second conductive film,
the light transmittance portion includes an opening which is formed in and surrounded on every side by the first conductive film or the second conductive film, and
the comb-like source electrode and the comb-like drain electrode are spaced at a distance smaller than a width of the opening, in the first channel area.

6. The display device according to claim 5,
wherein the capacitor is divided into a first capacitor and a second capacitor, and
the light transmittance portion is provided between the first capacitor and the second capacitor.

7. The display device according to claim 5,
wherein the light transmittance portion is surrounded by at least one of a source signal line and a drain signal line of the main thin film transistor in at least three ways, when viewed from a display direction.

8. The display device according to claim 5,
wherein
the first and second channel areas are formed into a crank shape as a whole.

9. The display device according to claim 5,
wherein the light transmittance portion is surrounded by the first and second conductive film in at least three ways, when viewed from a display direction.

\* \* \* \* \*